United States Patent
Lin (10) Patent No.: US 8,969,952 B2
(45) Date of Patent: Mar. 3, 2015

(54) SEMICONDUCTOR DEVICE WITH REDUCED MILLER CAPACITANCE AND FABRICATION METHOD THEREOF

(71) Applicant: Anpec Electronics Corporation, Hsin-Chu (TW)

(72) Inventor: Yung-Fa Lin, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 151 days.

(21) Appl. No.: 13/742,320

(22) Filed: Jan. 15, 2013

(65) Prior Publication Data

US 2014/0145258 A1  May 29, 2014

(30) Foreign Application Priority Data

Nov. 23, 2012  (TW) .............................. 101143944 A (51) Int. Cl.
*H01L 29/78*  (2006.01)
(52) U.S. Cl.
CPC .................................. *H01L 29/7827* (2013.01)
USPC .......................................... 257/330; 438/270
(58) Field of Classification Search
CPC ...................... H01L 29/7827; H01L 29/66734; H01L 29/78
USPC .................................... 257/330, 341; 438/270
See application file for complete search history.

(56) References Cited

U.S. PATENT DOCUMENTS

| 5,442,214 A * | 8/1995 | Yang ............................. 257/328 |
| 6,194,741 B1 * | 2/2001 | Kinzer et al. ................... 257/77 |
| 2006/0086972 A1 * | 4/2006 | Shibata et al. ................ 257/330 |
| 2008/0149963 A1 | 6/2008 | Adan |
| 2012/0248461 A1 | 10/2012 | Masuda et al. |

FOREIGN PATENT DOCUMENTS

| TW | 200703646 | 1/2007 |
| TW | 201241993 | 10/2012 |

* cited by examiner

*Primary Examiner* — Theresa T Doan
(74) *Attorney, Agent, or Firm* — Winston Hsu; Scott Margo (57) ABSTRACT

A semiconductor power device includes an epitaxial layer grown on a semiconductor substrate; an ion well with a junction depth in the epitaxial layer; a gate trench with a depth deeper than the junction depth in the ion well; a gate oxide layer in the gate trench; a gate embedded the gate trench; and a pocket doping region in the epitaxial layer. The pocket doping region is adjacent to and covers at least a corner of the gate trench.

8 Claims, 7 Drawing Sheets

SEMICONDUCTOR DEVICE WITH REDUCED MILLER CAPACITANCE AND FABRICATION METHOD THEREOF

BACKGROUND OF THE INVENTION

1. Field of the Invention

The present invention relates generally to the field of semiconductor technology. More particularly, the present invention relates to a method for fabricating a metal-oxide-semiconductor field-effect transistor (MOSFET) device with reduced Miller capacitance.

2. Description of the Prior Art

As known in the art, the rise of on-resistance of traditional planar power DMOS devices (DMOS) is contributed from the channel region, the accumulation layer and junction field effect transistor (JFET).

In order to reduce the resistance of the above-mentioned area, trench type power devices (UMOS) are proposed. Since JFET region does not exist in a UMOS, the cell size can be reduced and the channel density is increased, thereby resulting in a lower on-resistance, but on the other hand, the UMOS devices has higher gate-to-drain capacitance (Miller capacitance) that affects the switching speed.

SUMMARY OF THE INVENTION

It is one object of the present invention to provide an improved power semiconductor device and fabrication method thereof in order to reduce Miller capacitance.

According to one embodiment, a semiconductor power device includes a semiconductor substrate having a first conductivity type; an epitaxial layer on the semiconductor substrate; an ion well having a second conductivity type in the epitaxial layer, wherein the ion well has a junction depth; a gate trench in the epitaxial layer, wherein a depth of the gate trench is greater than the junction depth of the ion well; a gate oxide layer on interior surface of the gate trench; a gate within the gate trench; and at least a pocket doping region having the second conductivity type within the epitaxial layer and being adjacent to and covering a corner portion of the gate trench.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
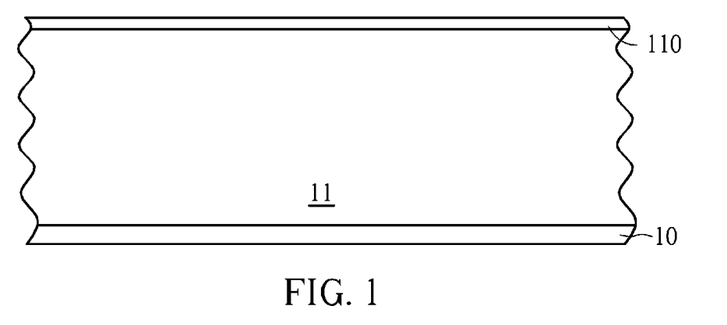
FIGS. 1-8 are schematic, cross-sectional diagrams illustrating a method for fabricating a semiconductor transistor device in accordance with one embodiment of the invention.

FIGS. 1-8 are schematic, cross-sectional diagrams illustrating a method for fabricating a semiconductor transistor device in accordance with one embodiment of the invention. As shown in FIG. 1, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as an N type epitaxial silicon layer on the semiconductor substrate 10. A pad layer 110 such as a pad oxide layer may be formed on the epitaxial layer 11.

Figure 2:
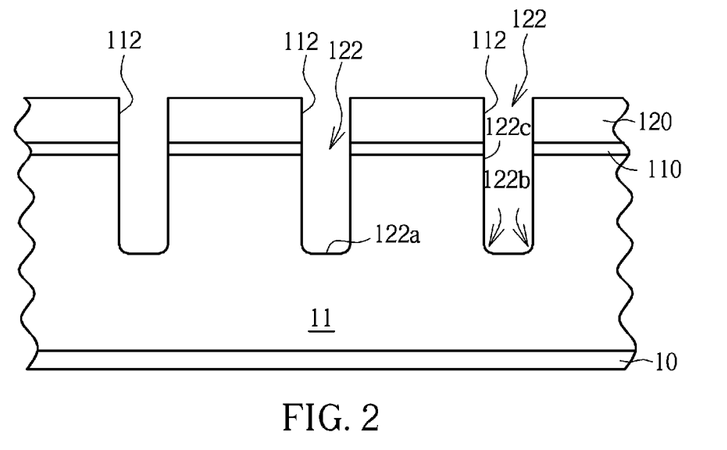

As shown in FIG. 2, a hard mask layer 120 such as a silicon nitride layer is deposited on the epitaxial layer 11. A lithographic process and an etching process are performed to form openings 112 in the hard mask layer 120. Subsequently, a dry etching process is performed to etch the epitaxial layer 11 through the openings 112 to a predetermined depth within epitaxial layer 11, thereby forming gate trenches 122. The gate trench 122 comprises a bottom 122a, corner portion 122b connecting the bottom 122a, and vertical sidewall 122c.

Figure 3:
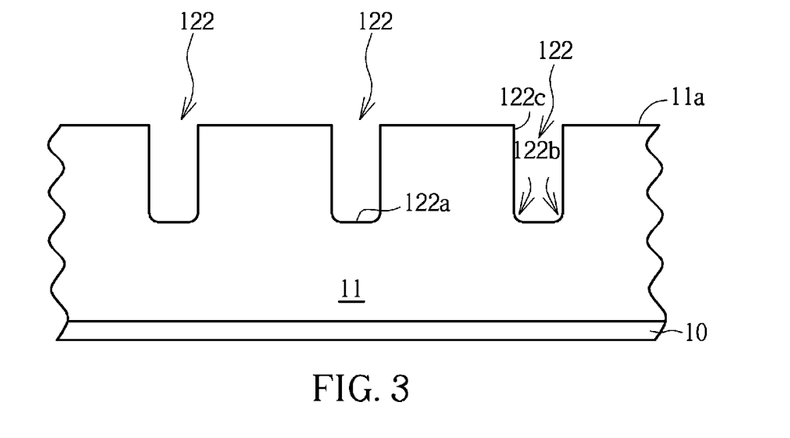

As shown in FIG. 3, the interior surfaces of the gate trenches 122 are oxidized to form a sacrificial oxide layer (not explicitly shown) within each of the gate trenches 122. The sacrificial oxide layer is then removed. Subsequently, the hard mask layer 120 and the pad layer 110 are removed to expose the surface 11a of the epitaxial layer 11.

Figure 4:
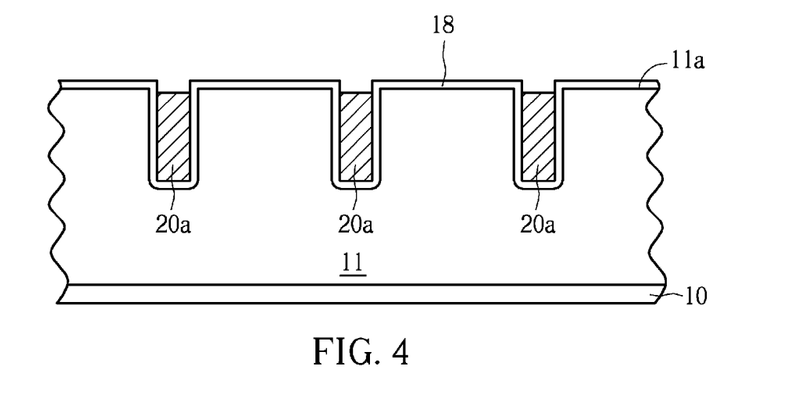

As shown in FIG. 4, a thermal oxidization process is performed to form a gate oxide layer 18 on the exposed surface 11a of the epitaxial layer 11 and the surface of each of the gate trenches 122 including the bottom 122a, the corner portion 122b, and the vertical sidewall 122c. A chemical vapor deposition (CVD) process is carried out to deposit a polysilicon layer (not shown) in a blanket manner. The deposited polysilicon layer fills the gate trenches 122. Subsequently, an etching process is performed to etch away a portion of the polysilicon layer to separate trench gates 20a within the gate trenches 122. The gate oxide layer 18 on the epitaxial layer 11 is revealed.

Figure 5:
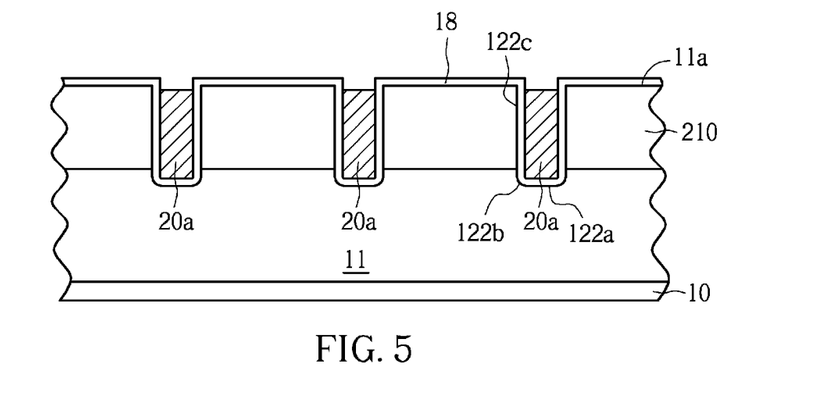

As shown in FIG. 5, an ion implantation process is performed to form an ion well 210 such as a P well in the epitaxial layer 11. A thermal drive in process may be performed to activate the dopants implanted within the epitaxial layer 11. According to the embodiment, the junction depth of the ion well 210 is shallower than the depth of the gate trenches 122. In other words, the bottom 122a and the corner portion 122b is within the epitaxial layer 11. According to another embodiment, the ion implantation process for forming the ion well 210 and the thermal drive-in process may be performed prior to the formation of the gate trenches 122.

Figure 6:
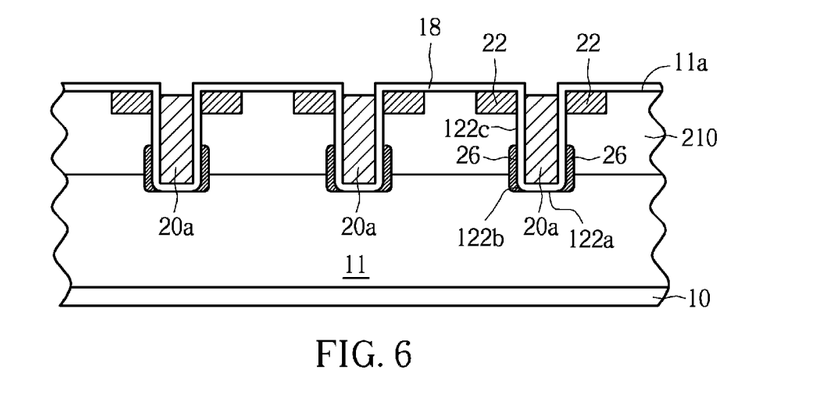
Figure 9:
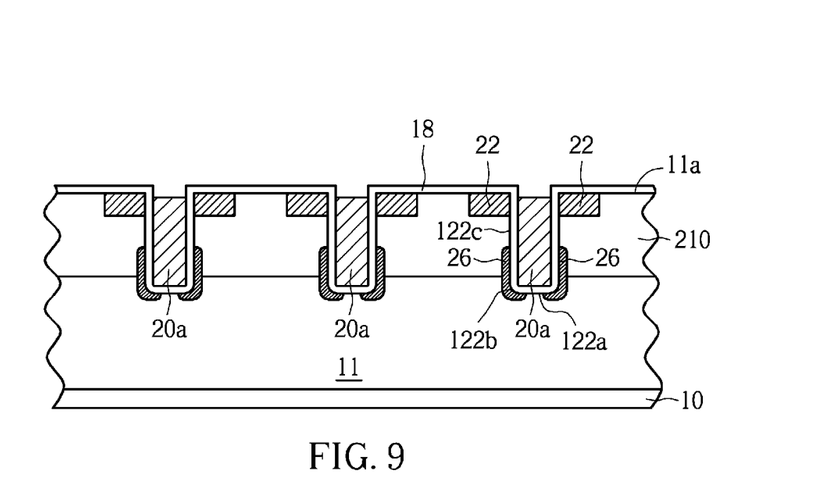
FIG. 9 illustrates the pocket doping region that extends under the bottom of the gate trench according to another embodiment.

As shown in FIG. 6, a lithographic process and an ion implantation process are performed to form a source doping region 22 such as an N+ source doping region at the surface of the epitaxial layer 11, and a pocket doping region 26 such as P pocket adjacent to the corner portion 122b of the gate trench 122 within the epitaxial layer 11. The pocket doping region 26 may traverse the junction between the ion well 210 and the epitaxial layer 11 and at least covers the corner portion 122b of the gate trench 122. Alternatively, the pocket doping region 26 may further extend to the bottom 122a of the gate trench 122, as shown in FIG. 9, such that the Miller capacitance can be reduced.

According to the embodiment, the doping concentration of the pocket doping region 26 is greater than that of the epitaxial layer 11. According to the embodiment, the ion implantation process for forming the pocket doping region 26 is performed prior to the ion implantation process for forming the source doping region 22. According to the embodiment, after the ion implantation processes for forming the pocket doping region 26 and the source doping region 22 are completed, a thermal drive-in process is performed to activate the dopants within the pocket doping region 26 and the source doping region 22 at the same time.

According to the embodiment, the ion implantation for forming the pocket doping region 26 may be performed single time or multiple times. According to the embodiment, the energy of the ion implantation for forming the pocket doping region 26 may range between 200 KeV and 2 MeV. The dose of the ion implantation for forming the pocket doping region 26 may range between 1E11 atoms/cm2 and 1E14 atoms/cm2.

Figure 7:
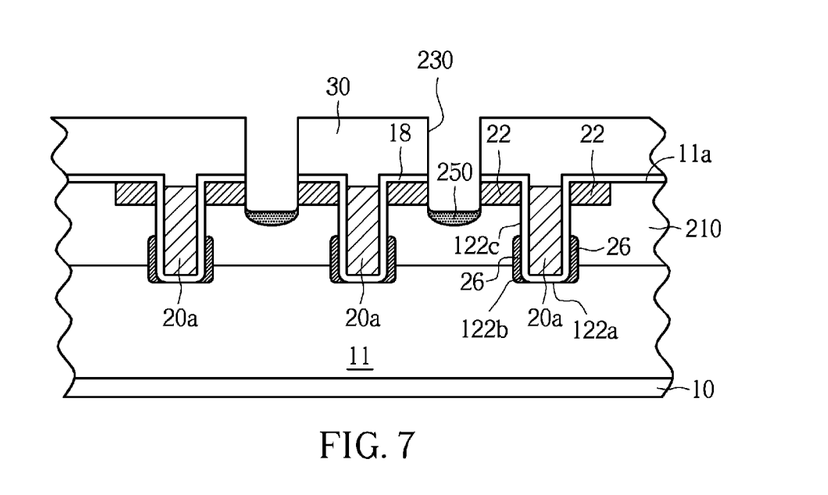
Figure 8:
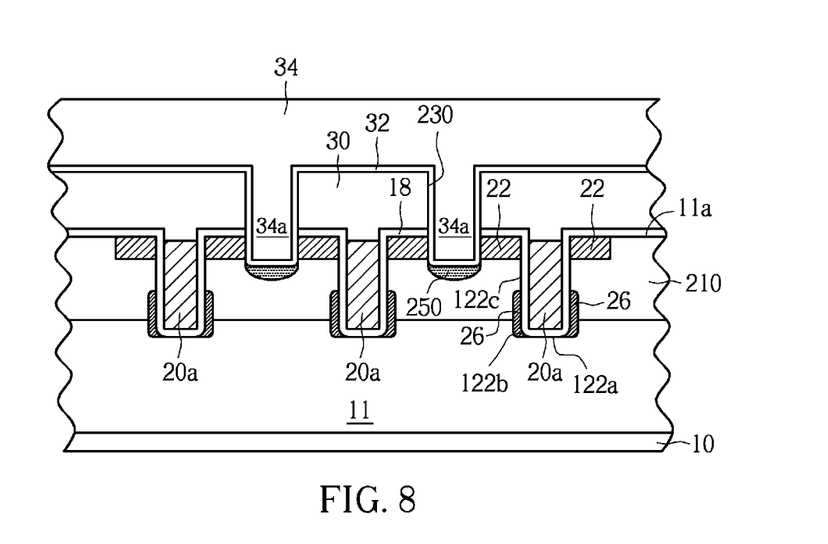

As shown in FIGS. 7-8, contact holes are formed and metalized. To form the metalized contact holes, an inter-layer dielectric (ILD) layer 30 is first deposited. Then contact holes 230 are formed in the ILD layer 30. Thereafter, contact doping region 250 such as P+ doping region is formed at the bottom of each of the contact holes 230. Barrier layer 32 and metal layer 34 are deposited to fill the contact holes 230, thereby forming the contact elements 34a. It is advantageous to use the pocket doping region 26 that helps a vertical channel extend into the epitaxial layer 11 adjacent to the bottom 122a of the gate trench 122, thereby reducing Millar capacitance.

Figure 10:
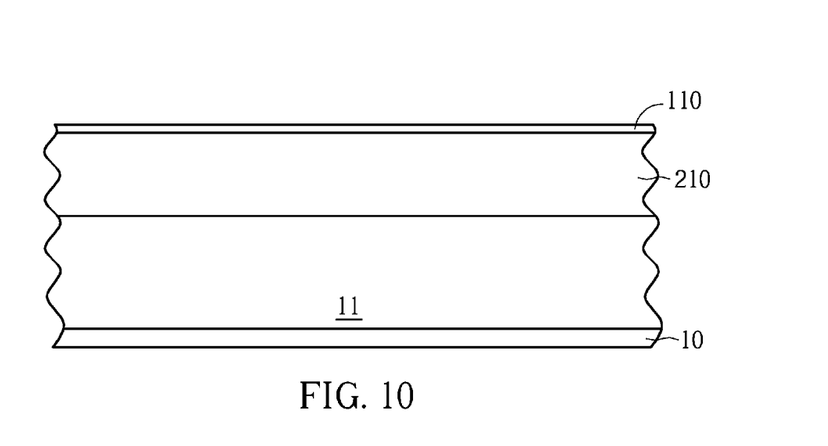
FIGS. 10-14 are schematic, cross-sectional diagrams illustrating a method for fabricating a semiconductor transistor device in accordance with another embodiment of the invention

FIGS. 10-14 are schematic, cross-sectional diagrams illustrating a method for fabricating a semiconductor transistor device in accordance with another embodiment of the invention. As shown in FIG. 10, likewise, a semiconductor substrate 10, such as an N type heavily doped silicon substrate, is provided. The semiconductor substrate 10 may act as a drain of the semiconductor transistor device. Subsequently, an epitaxial process is performed to form an epitaxial layer 11 such as an N type epitaxial silicon layer on the semiconductor substrate 10. A pad layer 110 such as a pad oxide layer may be formed on the epitaxial layer 11. Subsequently, an ion implantation process is carried out to form an ion well 210 such as P well within the epitaxial layer 11. A thermal drive-in process is then performed to activate the implanted dopants within the epitaxial layer 11.

Figure 11:
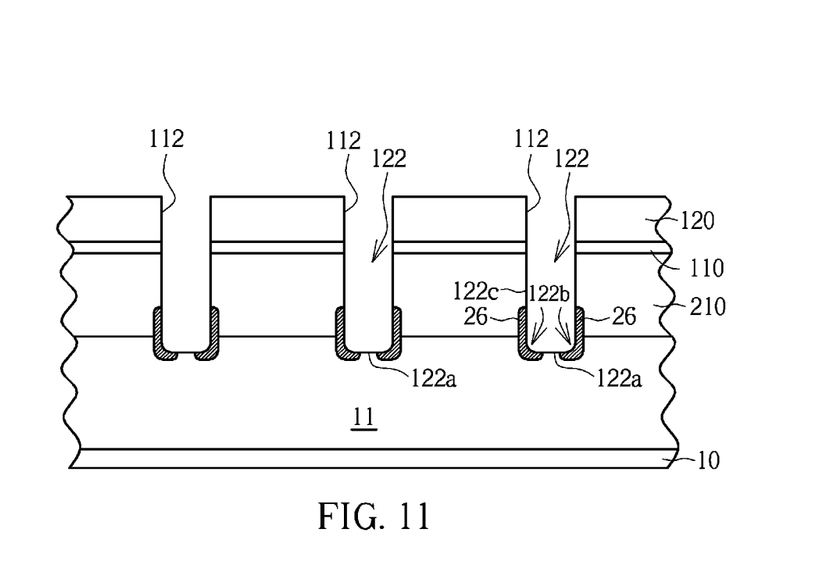

As shown in FIG. 11, a hard mask layer 120 such as a silicon nitride layer is deposited on the epitaxial layer 11. A lithographic process and an etching process are performed to form openings 112 in the hard mask layer 120. Subsequently, a dry etching process is performed to etch the epitaxial layer 11 through the openings 112 to a predetermined depth within the epitaxial layer 11, thereby forming gate trenches 122. The gate trench 122 comprises a bottom 122a, corner portion 122b connecting the bottom 122a, and vertical sidewall 122c. According to the embodiment, the junction depth of the ion well 210 is shallower than the depth of the gate trenches 122. In other words, the bottom 122a and the corner portion 122b is within the epitaxial layer 11.

Subsequently, an ion implantation process such as a tilt angle ion implantation is performed to form a pocket doping region 26 such as P pocket adjacent to the corner portion 122b of the gate trench 122 within the epitaxial layer 11 through the gate trench 122. The pocket doping region 26 may traverse the junction between the ion well 210 and the epitaxial layer 11 and at least covers the corner portion 122b of the gate trench 122. According to the embodiment, the doping concentration of the pocket doping region 26 is greater than that of the epitaxial layer 11. According to the embodiment, the ion implantation for forming the pocket doping region 26 may be performed single time or multiple times. According to the embodiment, the energy of the ion implantation for forming the pocket doping region 26 may range between 200 KeV and 2 MeV. The dose of the ion implantation for forming the pocket doping region 26 may range between 1E11 atoms/cm2 and 1E14 atoms/cm2.

Figure 12:
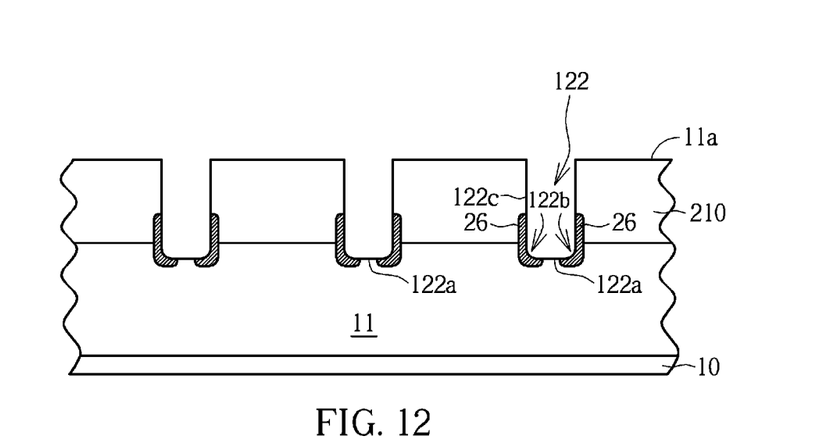

As shown in FIG. 12, the interior surfaces of the gate trenches 122 are oxidized to form a sacrificial oxide layer (not explicitly shown) within each of the gate trenches 122. The sacrificial oxide layer is then removed. Subsequently, the hard mask layer 120 and the pad layer 110 are removed to expose the surface 11a of the epitaxial layer 11.

Figure 13:
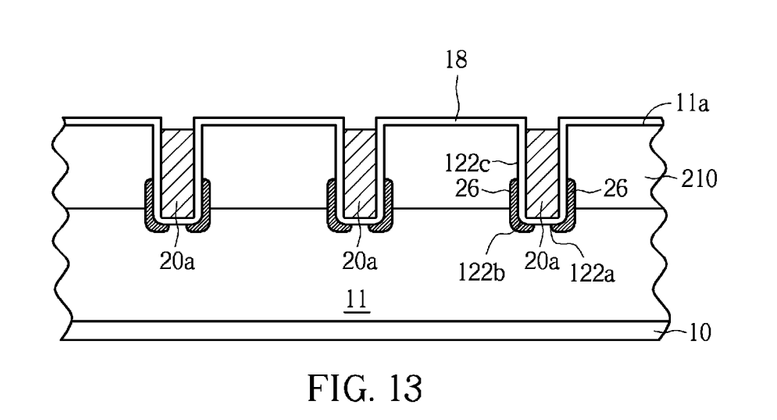

As shown in FIG. 13, a thermal oxidization process is performed to form a gate oxide layer 18 on the exposed surface 11a of the epitaxial layer 11 and the interior surface of each of the gate trenches 122 including the bottom 122a, the corner portion 122b, and the vertical sidewall 122c. A chemical vapor deposition (CVD) process is carried out to deposit a polysilicon layer (not shown) in a blanket manner. The deposited polysilicon layer fills the gate trenches 122. Subsequently, an etching process is performed to etch away a portion of the polysilicon layer to separate trench gates 20a within the gate trenches 122. The gate oxide layer 18 on the epitaxial layer 11 is revealed.

Figure 14:
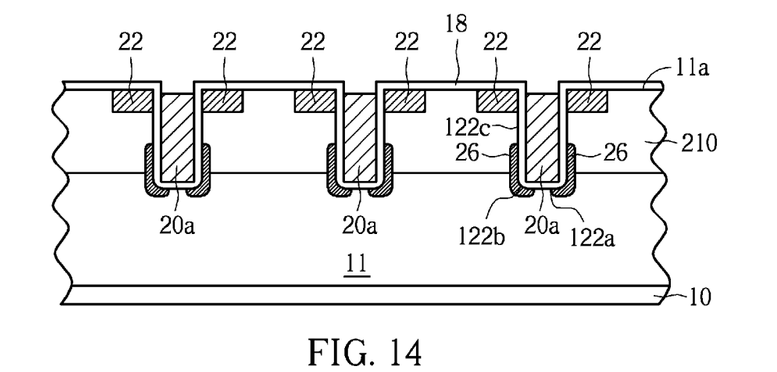

As shown in FIG. 14, an ion implantation process is performed to form a source doping region 22 such as an N+ source doping region at the surface of the epitaxial layer 11. A thermal drive-in process may be performed to activate the implanted dopants within the pocket doping region 26 and the source doping region 22 at the same time.

Finally, contact holes are formed and metalized. To form the metalized contact holes, similar to the steps depicted in FIGS. 7-8, an inter-layer dielectric (ILD) layer 30 is first deposited. Then contact holes 230 are formed in ILD layer 30. Thereafter, contact doping region 250 such as P+ doping region is formed at the bottom of each of the contact holes 230. Barrier layer 32 and metal layer 34 are deposited to fill the contact holes 230, thereby forming the contact elements 34a.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power semiconductor device, comprising:
 a semiconductor substrate having a first conductivity type;
 an epitaxial layer on the semiconductor substrate;
 an ion well having a second conductivity type in the epitaxial layer, wherein the ion well has a junction depth;
 a gate trench in the epitaxial layer, wherein a depth of the gate trench is greater than the junction depth of the ion well;
 a gate oxide layer on interior surface of the gate trench;
 a gate within the gate trench; and
 at least a pocket doping region having the second conductivity type within the epitaxial layer and being situated directly under a bottom surface of the gate trench, wherein the pocket doping region extends to cover a lower sidewall of the gate trench and wherein the pocket doping region does not completely cover the bottom surface of the gate trench.

2. The power semiconductor device according to claim 1 further comprising a source doping region at a surface of the epitaxial layer and adjacent to the gate trench.

3. The power semiconductor device according to claim 2 wherein the source doping region has the first conductivity type.

4. The power semiconductor device according to claim 1 wherein the first conductivity type is N type and the second conductivity type is P type.

5. The power semiconductor device according to claim 1 wherein the epitaxial layer has the first conductivity type.

6. The power semiconductor device according to claim 1 wherein the pocket doping region traverses a junction between the ion well and the epitaxial layer.

7. The power semiconductor device according to claim 1 wherein the pocket doping region has a doping concentration greater than that of the epitaxial layer.

8. The power semiconductor device according to claim 1 wherein the pocket doping region extends to the bottom surface of the gate trench.

\* \* \* \* \*